(12) United States Patent
Koskenmaki et al.

(10) Patent No.: US 6,805,940 B2
(45) Date of Patent: Oct. 19, 2004

(54) METHOD FOR MAKING CONDUCTIVE CIRCUITS USING POWDERED METALS

(75) Inventors: David C. Koskenmaki, Pine Mountain Club, CA (US); David W. Kuhns, Minneapolis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 29 days.

(21) Appl. No.: 09/952,239

(22) Filed: Sep. 10, 2001

(65) Prior Publication Data

US 2003/0091789 A1 May 15, 2003

(51) Int. Cl.$^7$ ................................................. B32B 3/10
(52) U.S. Cl. ........................ 428/138; 428/156; 428/131; 428/209; 174/255; 174/256; 174/258; 361/739; 361/746; 361/750; 361/762
(58) Field of Search .............................. 428/156, 151, 428/138, 209; 174/255, 256, 258; 361/739, 746, 750, 762

(56) References Cited

U.S. PATENT DOCUMENTS

| | | | |
|---|---|---|---|
| 2,721,152 A | | 10/1955 | Hopf et al. |
| 2,757,443 A | * | 8/1956 | Steigerwalt et al. ........... 29/848 |
| 2,963,748 A | | 12/1960 | Young |
| 3,628,243 A | * | 12/1971 | Phol et al. .................... 29/849 |
| 3,800,020 A | | 3/1974 | Parfet |
| 4,247,498 A | | 1/1981 | Castro |
| 4,403,107 A | | 9/1983 | Hoffman |
| 4,614,837 A | | 9/1986 | Kane et al. |
| 4,799,983 A | * | 1/1989 | Desai ...................... 156/89.16 |
| 4,867,881 A | | 9/1989 | Kinzer |
| 5,032,450 A | | 7/1991 | Rechlicz et al. |
| 5,059,485 A | | 10/1991 | Parr et al. |
| 5,061,438 A | | 10/1991 | Lillie et al. |
| 5,196,262 A | | 3/1993 | Schwarz et al. |
| 5,761,801 A | * | 6/1998 | Gebhardt et al. ............. 29/846 |
| 5,817,834 A | | 10/1998 | Kameswaran |

FOREIGN PATENT DOCUMENTS

WO    WO 0145935    6/2001

OTHER PUBLICATIONS

Rodal. "Exploring Volume Change, Angular Distortion in a Calendering Nip." *Pulp & Paper*, 1993, pp. 1–8.

* cited by examiner

*Primary Examiner*—William P. Watkins, III
(74) *Attorney, Agent, or Firm*—Lisa P. Fulton

(57) ABSTRACT

A method for making an electrically conductive pattern, including:
  (a) depositing on a substrate a metal powder composition consisting essentially of at least one metal powder, wherein the substrate is selected from the group consisting of paper and materials that are at least about 10% compressible; and
  (b) densifying the composition to form a conductive pattern on the substrate.

10 Claims, 4 Drawing Sheets

METHOD FOR MAKING CONDUCTIVE CIRCUITS USING POWDERED METALS

TECHNICAL FIELD

This invention relates to electrically conductive circuits made from metal powder compositions, as well as to methods for their manufacture.

BACKGROUND

Patterned metal articles, such as printed circuit boards, have many uses in the electronics industry. Printed circuits may be made by applying pressure with a heated die to metallic particles on an adhesive-coated substrate. Metal particles may also be mixed with a curable organic binder, and applied to a substrate using an adhesive layer, heat and pressure. Printed circuits may also be produced by embedding conductive granules mixed with an inorganic matrix material into a heat-softenable substrate. Silk screening methods may also be used to apply mixtures of organic materials and conductive particles to substrates, and compositions including metallo-organic decomposition compounds and metallic particles may also be silk screened on a substrate and heated to form a circuit pattern.

The adhesives and organic binders in these compositions are poor conductors of electricity, and, when mixed with metallic particles, reduce the overall conductivity of the resulting circuit pattern. The use of inorganic and metallo-organic compounds is limited to specific combinations of materials and particular substrates, and requires high processing temperatures.

SUMMARY

In one aspect, the invention is a method for making an electrically conductive pattern, including: (a) depositing on a substrate a metal powder composition consisting essentially of at least one metal powder, wherein the substrate is selected from the group consisting of paper and materials that are at least about 10% compressible; and (b) densifying the composition to form a conductive pattern on the substrate.

In another aspect, the invention is an article with circuit elements including a conductive pattern on a substrate, wherein the conductive pattern consists essentially of at least one densified metal powder, and wherein the substrate is selected from the group consisting of paper and materials that are at least about 10% compressible.

The invention makes it possible to produce a suitably conductive pattern including circuit elements on paper and other compressible substrates. These substrates are generally inexpensive materials and provide benefits to the final article such as, for example, flexibility, conformability, specific surface properties, and ease of recycling. The inventive method may be performed at low cost since it requires a minimum number of process steps and materials, does not require extreme, specialized or slow process steps, and minimizes process waste and pollution.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
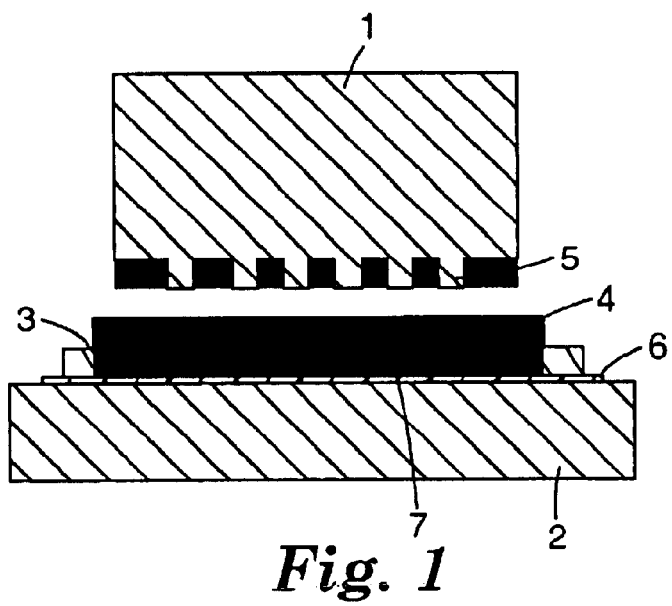
FIG. 1 is a cross-sectional view of a hydraulic press used in an embodiment of the invention.

Referring to FIG. 1, a layer of a metal powder composition 4 is deposited onto all or a selected part of a substrate 3.

The metal powder composition 4 preferably includes finely divided metal particles. The metal particles suitable for use in the metal powder composition include copper, tin, nickel, iron, steel, platinum, aluminum, silver, gold, lead, zinc and the like, and copper is particularly preferred. The metal powder composition may also include conductive non-metal powders, such as, for example, graphite. The metal powder composition 4 may contain only one metal or it may contain two or more metals, in such combinations as a mixture of particles of two or more metals, particles comprising alloys, blends or mixtures, particles of one metal coated with a second metal, and the like. Alternatively, a metal powder composition or combination of metal powder compositions can be deposited as an underlayer, and a different metal powder composition or combination of metal powder compositions can then be deposited as an overlayer.

The shape of the particles in the metal powder composition 4 can vary widely. The metal particles can be of the same shape or of different shapes and can be regularly or irregularly shaped. Exemplary particle shapes include, for example, spheres, oblongs, needles, dendrites, polyhedra (e.g., tetragons, cubes, pyramids and the like), prisms, flakes, rods, plates, fibers, chips, whiskers, and mixtures thereof. Dendritic metal powders are preferred. Similarly, the sizes of the metal particles in the metal powder composition 4 can vary widely, and may include monodisperse particles, a multi-modal distribution of particle sizes, or a broad distribution of particle sizes. Preferably, the particles in the metal powder composition 4 have a mean particle size of approximately 0.1 to about 2000 $\mu$m; preferably between about 0.2 $\mu$m and about 1000 $\mu$m; most preferably between about 1 $\mu$m and about 500 $\mu$m.

Figure 2:
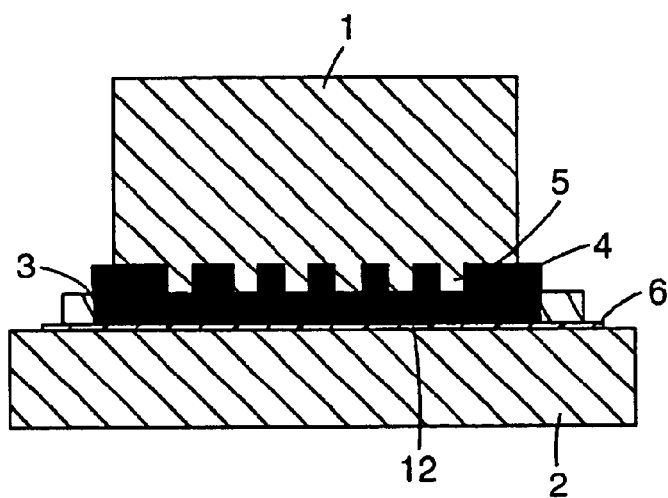
FIG. 2 is a cross-sectional view of the hydraulic apparatus of FIG. 1 as used in the capture step of an embodiment of the invention.

One or more of the metal powders in the metal powder composition can be treated to remove all or a portion of any surface oxides. Methods are known to those skilled in the art and vary for different metals, and include reduction (e.g., with hydrogen at elevated temperatures), washing with acidic or basic solutions, and the like. This treatment step can be carried out prior to application of the metal powder composition to the substrate, while the metal powder composition is deposited on the substrate (as shown in FIG. 1) or after capture of the metal powder (as shown in FIG. 2, described below). Preferably such treatment occurs prior to application of the metal powder composition to the substrate.

The metal powder composition 4 can be deposited onto the substrate 3 in a variety of forms, such as a substantially dry powder, or with a gas, liquid or solid material added to modify its flow properties. Such additives are preferably substantially removed from the metal powder at some step during the practice of the inventive method, so that the final article contains metal patterns comprising no more than 5 percent by weight of additives, preferably no more than 3% by weight, and most preferably no more than 1% by weight. Suitable additive agents to modify flow properties may include water, solvents, anti-caking agents, lubricants, air, nitrogen and combinations thereof. Liquids that function as carrier materials are preferred. If a carrier liquid is used, the metal powder composition may appear in the form of a dampened powder or a slurry. The metal powder composition, whether deposited with flow-modifying additives or not, should have flow characteristics that allow it to level and fill features on the surface of the substrate such as surface voids, spaces between fibers or optional vias 7 (See FIG. 1).

The metal powder composition may include additional components and additives, for example, wetting agents, antistatic agents, antiflocculants, colorants, cleaning agents, anti-oxidants and wet or dry fluxes, provided that the final article contains metal patterns comprising no more than 5 percent by weight of additives, preferably no more than 3% by weight, and most preferably no more than 1% by weight. For example, if the metal powder composition is a liquid slurry, the slurry can also contain chemical agents to prevent oxidation of the metal powder.

The substrate 3 is paper or a compressible material. As a first step in the practice of the inventive method, a substrate meeting this requirement is selected. As used herein, compressible means that a substrate reduces in its dimension parallel to an applied pressure and that the total volume of the substrate is also reduced by a similar amount. When used herein as a quantitative measure, X % compressible means that the dimension of a substrate measured parallel to an applied pressure of 30 MPa is [(100−X)/100] times its dimension in this direction at 0.07 MPa and the total volume of the substrate at 30 MPa is [(100−X)/100] times its volume at 0.07 MPa. If the dimension change in the direction of the applied pressure and the volume change yield different values of X, then the smaller X of the two values is used to define the quantitative compressibility of the material.

Compressibility is a physical property of a substrate that may be measured as part of the process of substrate selection. The compressibility is measured over an entire sample of a substrate (as described, for example, in Example 32 below), and is not a function of localized behavior as may be observed during the application of pressure in a particular pattern to a portion of a substrate. Compressibility is a function of the structural properties of the substrate material, particularly the presence of significant amounts of voids, pores, inter-fiber spaces or other open spaces. Preferably, following release of an applied pressure, substrates still show dimension and volume changes of at least 10%, more preferably they show dimension and volume changes that are at least 50% of the percent compressibility observed at 30 MPa, and most preferably they maintain dimension and volume changes that are at least 75% of the percent compressibility achieved at 30 MPa.

Fully or highly dense materials, such as extruded or cast polymeric films, may exhibit isotropic or anisotropic volume changes as a result of applied pressure, due to changes between the crystalline and amorphous state. These materials are typically not sufficiently compressible for use in the process of the invention. Similarly, fully or highly dense green-state composite materials may show volume changes upon heating and curing, but would not be expected to be sufficiently compressible for use in the process of the invention.

The substrate 3 is preferably flexible, which means than it may be bent by hand around a rod of approximately 5 cm in diameter, preferably 2 cm in diameter. The substrate can be of any suitable thickness that maintains this flexibility, and preferably has a thickness of less than 5000 microns; more preferably less than 2000 microns; most preferably less than 1000 microns.

The substrate 3 is preferably less conductive that the conductive metal pattern which is formed through the practice of this invention. Substrates 3 suitable for the practice of this invention include paper and compressible fibrous and non-fibrous materials, including those manufactured from synthetic or naturally occurring polymers, or combinations thereof. Suitable forms of these substrates include nonwovens including dry-lay and wet-lay nonwovens, nonwovens made by melt-blown fiber, spun bond or spun lace processes, woven and knit fabrics, membranes, foams (preferably open-cell foams) and expanded webs, and webs comprised of cast fibers.

Paper is one preferred substrate 3 and a variety of papers are suitable, including but not limited to kraft paper, stationery paper, copier paper, filter paper, newsprint, cardstock, folder stock, printing paper, specialty papers, paper products such as pulp board and the like. Suitable papers may be made by various processes and may contain fillers, sizing agents, pigments, dyes, and others additives as known to those skilled in the art. Suitable papers may be calendered or non-calendered, processed to provide various finishes and coated or uncoated.

Suitable nonwoven substrates can include membranes or porous materials, such as, for example, ultrafiltration membranes, microporous materials, cast polymeric membranes, and thermally induced phase transition materials (TIPS), which are described in U.S. Pat. Nos. 4,247,498 and 4,867,881. One suitable substrate is a particle-filled, microporous material, commercially available from PPG Industries, Pittsburgh, PA, under the trade designation Teslin. Teslin is described by its manufacturer as a dimensionally stable, polyolefin based, microporous, printing sheet with 60% of its weight including a non-abrasive filler and with 65% of its volume including air.

Suitable substrate materials may be fibrous and fiber-like materials including silk and cellulosic or lignocellulosic materials, such as for example, flax, hemp, cotton, jute, or synthetic cellulosic or lignocellulosic materials such as rayon.

Suitable substrates can be made from a variety of polymers, including thermoplastic, thermoset, elastomeric, and crosslinked polymers. Examples of suitable polymers include polyamides, polyurethanes, polyolefins (e.g., polyethylene and polypropylene), polystyrene, polycarbonate, polyethers, polyvinylchloride, silicones, fluoropolymers, polysulfones, nylons, cellulose acetate, ethylenically unsaturated polymers, and suitable combinations thereof.

Substrates can optionally include inorganic filler particles, such as ceramics, metal oxides (e.g., tantalum oxide) and high dielectric constant ceramics (e.g., barium titanate, barium strontium titanate, titanium dioxide, and lead zirconium titanate, and mixtures thereof). Other suitable ceramic fillers include silica, precipitated silica, zirconia, alumina, glass fibers, and the like. Suitable non-ceramic fillers include polymer fibers and carbon fibers. Other additives include, for example, dyes, pigments, plasticizers, sizing agents, anti-oxidants, flame retardants, and the like.

Substrate materials can optionally receive additional chemical or physical treatment, such as calendering, embossing, surface treatment (e.g. plasma treatment, Corona treatment or silanization) and the like, prior to the deposition of the metal powder composition.

The substrate may comprise a single layer or optionally a plurality of layers arranged in a laminate structure. The layers in the laminate structure may be made of the same material or of different materials. The substrate may include a removable carrier layer. The substrate may also include an adhesive layer, so long as the multilayer substrate is compressible and the adhesive layer is not positioned or processed to capture the metal powder composition or adhere conductive metal patterns to the substrate.

Any suitable method may be used to deposit the metal powder composition onto the substrate, such as, for example, notch bar coating, knife coating, dipping, sifting, screening, spraying, blowing, or application of a fluidized bed. The metal powder composition may be applied in a single application or in multiple applications, with the same or different metal powder compositions, or different compositions or amounts of composition may be applied to different regions of the substrate, depending on the desired shape, conductivity and thickness of the conductive pattern in the finished product.

FIG. 1 shows an optional via 7, which is a hole that passes completely through the substrate 3. The optional via 7 is filled with metal powder composition 4 as shown in FIG. 1. An optional liner 6 may be used to contain the metal powder composition 4 within the optional via 7 during processing.

The substrate 3 and the optional liner 6 reside on a platen 2, which may be maintained at a desired temperature. Although FIG. 1 depicts a flat configuration for platen 2 and substrate 3, other geometries are also within the scope of the invention, and in particular a curved geometry may be employed.

Hydraulic press 1 has a die 5 with projections or male portions. Although it is not visible in the cross-sectional representation in FIG. 1, the projections of die 5 are shaped to produce a pattern in the plane of the substrate. Any pattern may be machined onto the die 5 (and thereby imparted to metal powder composition 4 on substrate 3), such as, for example, straight or curved lines, grids, coils, circles, rectangles, triangles, hexagons and other geometric shapes which may be either solidly filled or outlines of these shapes, irregular shapes, and combinations thereof.

In one embodiment of the invention, referring to FIG. 2, pressure is then applied by hydraulic press 1 in the pattern of the projections of die 5 to metal powder composition 4 to capture a pattern 10 on the substrate. The captured pattern in regions 10 adheres to the substrate 3, while the metal powder composition in regions 11 remains uncaptured. The projections on the die 5 also capture the metal powder composition within a region 12 in the optional via 7.

The processing conditions used to capture the pattern will vary widely depending on the metal powders selected for use in the metal powder composition, as well as the properties of the substrate material. Temperatures, pressures and application times should be selected to substantially minimize, and preferably eliminate, damage to the substrate 3, such as melting, warping, buckling, blistering, or decomposing. Preferably, the platen 2 is maintained at a temperature between 50 and 25° C., and the die 5, or at least the raised portions of die 5, are maintained at a temperature between 20 and 250° C., preferably between 20 and 200° C. Useful processing pressure is in the range of 20 MPa to 400 MPa, and pressure is maintained for up to 300 seconds. Preferably, platen 2 and die 5 are maintained at about 20 to 25° C., and a pressure between about 35 MPa and 200 MPa is maintained for no more than about 60 seconds.

The capture process step may be performed in a continuous process using, for example, a rotary die, or in a batchwise or step-and-repeat process using a flat die in an hydraulic press. Substrate material may be handled in the form of narrow or wide webs, sheets, sheets supported on webs, and the like, and the use of this invention in the practice of large-scale manufacturing will be apparent to those skilled in the art.

To capture the metal powder composition 4, pressure may be applied by any known method, for example, using an hydraulic press alone or in combination with an acoustic apparatus, using a patterned ultrasonic horn (not in shown FIG. 1) patterned similarly to die 5. The application of acoustic energy may provide advantages in process conditions (such as lower temperature or pressure) or in the performance of the final article.

Repetitive capture steps using the same or different metal powder compositions on the same or different areas of substrate 3 may be performed, for example, to give a thicker captured region consisting of multiple layers of the same metal powder composition, or to provide discrete layers of two or more captured metals, or to provide different metals in different areas of substrate 3, or to meet specific product requirements for the final article.

Figure 3:
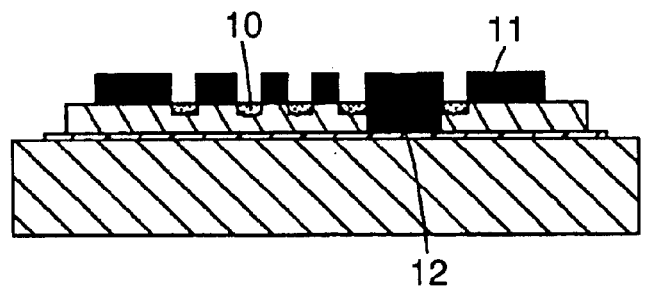
FIG. 3 is a cross-sectional view of an article following the capture step of FIG. 2.

Referring to FIG. 3, once the die 5 is removed, a captured pattern of metal powder composition adheres to the substrate 3 in regions 10, 12, while metal powder composition remains unadhered on the substrate 3 in regions 11. Although the adhered metal powder composition in region 10 is shown in FIG. 3 as having a top surface which is coplanar with the top surface of the substrate 3, in the practice of this invention the top surface of metal 10 may be above, coplanar with or below the top surface of the substrate 3. The residual, unadhered metal powder composition in regions 11 may optionally be substantially removed from the substrate by a variety of conventional methods, for example, compressed air, vacuum, vibration, brushing, blowing, gravity, aqueous wash, and suitable combinations thereof. The term capture as used herein means that the metal powder composition in regions 10, 12 which has been subjected to pressure by the projections of die 5 adheres sufficiently to the substrate 3 so that after removal of die 5 as shown in FIG. 3 the metal powder composition in regions 11 may subsequently be substantially removed without removing the adhered metal powder composition in regions 10, 12. Metal powder composition that is removed may optionally be recycled. Preferably, unadhered powder is removed before densification as shown in FIG. 4.

Figure 4:
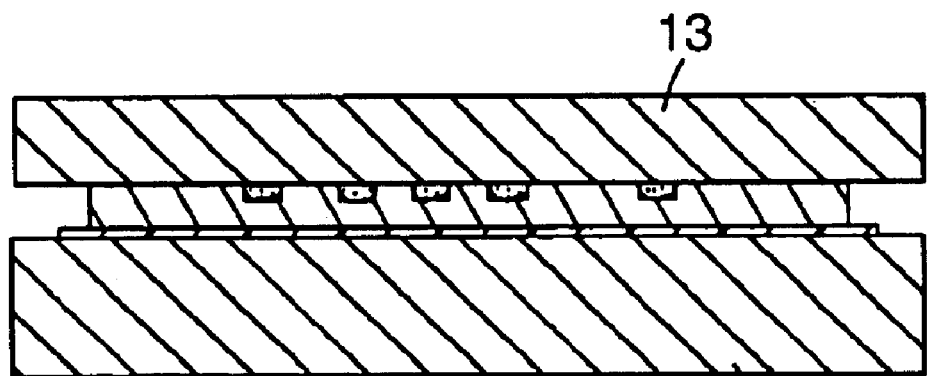
FIG. 4 is a cross-sectional view of a portion of an hydraulic apparatus as used in an embodiment of the densification step of an embodiment of the invention.

In one embodiment of the invention, referring to FIG. 4, a densifying energy in the form of a second pressure is then applied with platens 13, 22 to the pattern 10, 12 to densify the pattern. Preferably, this process step increases the adhesion of the pattern to the substrate 3 and makes the pattern more conductive. Optionally, this step smoothes the substrate. The resulting conductive pattern on the surface of the substrate 3 has a Figure of Merit (FOM, described in greater detail below) of greater than about 5%, preferably greater than about 10%, and more preferably greater than about 20%. The second pressure may be applied as hydraulic pressure, and optionally heat, acoustic or microwave energy may be simultaneously or subsequently applied. Ultrasonic energy, heat or microwave energy may also be employed prior to the application of pressure referred to in FIG. 4, or may be employed alone to accomplish densification without the application of a second pressure. Variations in process order and various combinations of processes and energy sources used to accomplish capture and densification are within the scope of the invention.

Preferably, the second pressure is applied to opposed sides of the patterned substrate 3 with platens 13, 22 to minimize distortion at the interface and between the edges of the conductive pattern 10 and the substrate surface. Although FIG. 4 depicts a flat configuration for each platen 13, 22 and substrate 3, other geometries are also within the scope of the invention, and in particular at least one curved geometry may be employed. Preferably, pressure is applied substantially equally to the metallized and unmetallized portions of the substrate.

The densification step may be performed in a continuous process by such means, for example, as calendar rolls, a hot zone or a sonication zone, or in a batchwise or step-and-repeat process using, for example, a hydraulic press, a thermal or microwave oven, or an ultrasonic horn. Substrate material may be handled in the form of narrow or wide webs, sheets, sheets supported on webs, and the like, and the use of this invention in the practice of large-scale manufacturing will be apparent to those skilled in the art.

The pressure applied in the densification step is about 20 MPa to about 400 MPa, preferably about 60 MPa to 200 MPa. Densification at these pressures is conducted at temperatures from about 20° C. to 250° C., preferably about 50° C. to 200° C. most preferably about 100° C. to about 150° C. With application of other sources of densifying energy such as ultrasonic energy, different temperatures ranges may be preferred, as is demonstrated in the Examples.

Figure 5:
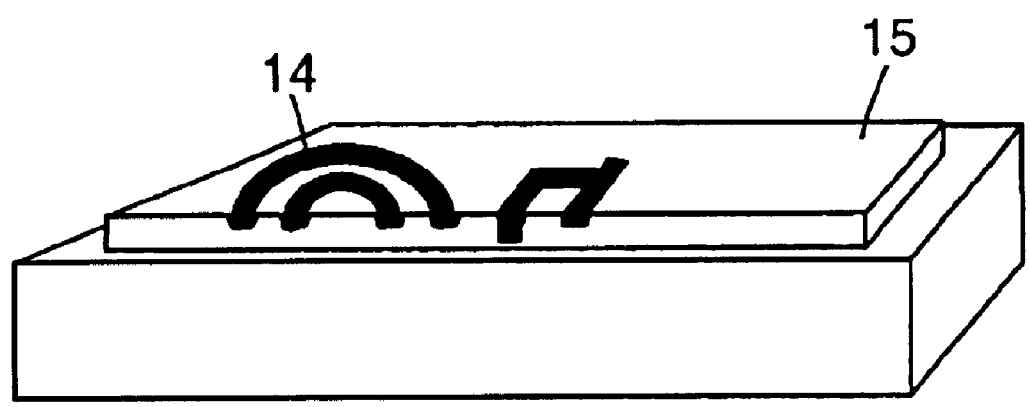
FIG. 5 is a perspective view of an article including circuit elements.

Referring to FIG. 5, the platen 13 is then removed, and the resulting article includes circuit elements with a conductive metal pattern 14 adhered on a surface 15 of the substrate 3. A circuit element is any metal pattern or shape or combination of metals, patterns and shapes that may comprise all or part of an element that is found in a functional electrical device. Examples include traces which provide electrically conductive paths or connections, capacitors or capacitor plates, inductive coils, and the like.

A Figure of Merit (FOM) can be used to compare a pressed powder measured resistance to the minimum possible theoretical resistivity for copper, according to the following equation:

% FOM=($R_{theoretical}$/$R_{measured}$)×100% where $R_{theoretical}$ is the resistivity of copper and $R_{measured}$ is the measured resistance of the pressed powder pattern. Resistance is the raw data that is measured for a particular sample, and this is normalized for the cross-section and length of a particular sample to arrive at a calculated resistivity, as described more fully in Example 1. The method of the present invention can be used to make articles comprising circuit elements with a conductive pattern having a Figure of Merit greater than about 5%, preferably greater than about 10%, and more preferably greater than about 20%.

The conductive pattern 14 adheres well to the substrate, and withstands moderate bending and abrasion. For example, adhesion of the metal pattern to the substrate can be determined by measuring the resistance of the metal pattern during and after the bending of the article around rods of various diameters, as described in Example 25. The change in resistivity upon bending depends on the components of the metal powder composition and the substrate material. Preferably, articles including the circuit elements will withstand bending around a rod of diameter of 50 mm, more preferably 20 mm, without significant resistance increases. Without wishing to be bound by theory, adhesion may be due to mechanical attachment or entanglement resulting from compressing the metal powder composition and substrate simultaneously.

Following the densification step, the article including circuit elements may optionally undergo further additional processing steps such as conversion, lamination, patterning, etching, coating, assembly and the like. Additional layers may be applied and these additional layers may also comprise electrically conductive patterns.

The process steps of the invention may be conducted at mild temperatures as indicated by the preferred ranges above. Lower process temperatures result in reduced processing costs and also enable the use of substrate materials that are not stable at high temperatures. It is advantageous to be able to select substrate materials for a variety of properties including flexibility, surface energy, environmental stability, reuse or recyclability, chemical composition, low cost and so on, as may be required to meet various product specifications, without being limited by process temperature requirements.

This invention is illustrated by the following examples, but the particular materials and amounts thereof recited in these examples, as well as other conditions and details should not be construed to unduly limit this invention.

EXAMPLES

Example 1

This example presents a sample Figure of Merit (FOM) calculation. The % FOM can be used to compare the measured resistance of a pressed powder pattern to the minimum possible theoretical resistivity for pure copper according to the following equation:

% FOM=($R_{theoretical}$/$R_{measured}$)×100 where $R_{theoretical}$ is the resistivity of pure copper and $R_{measured}$ is calculated from the measured resistance of the sample pressed powder pattern.

The density of solid copper is 8.96 g/cm$^3$. The resistivity of copper is 1.73×10$^{-6}$ ohms-cm. To normalize for the mass and cross section of the sample, the mass in grams per unit length in cm and resistance in ohm per unit length in cm are incorporated into the FOM equation, such that:

% FOM=($R_{theoretical}$/$R_{measured}$)×100 where: $R_{theoretical}$=(density of copper)(conductivity of copper)= 0.0000155 g-ohm/cm$^2$ $R_{measured}$=[(mass in grams per cm)($R_{measured}$ per cm)]

For example, a metal pattern was pressed onto a layer of copper powder to give a pattern having a mass (M) of 0.402 grams along the distance of the metal pattern, 123 cm. The resistance (R) for this length (L) was 5.7 ohms as measured by a Fluke 189 multimeter by putting the probes at each end of the metal pattern and reading the value in ohms. M/L= 0.402 g/123 cm=3.26×10$^{-3}$ g/cm and R/L=5.7/123=4.6× 10$^{-2}$ ohm/cm. The % FOM for this sample can be calculated as:

% FOM={0.0000155/[(3.26×10$^{-3}$)(4.6×10$^{-2}$)]}×100=10%

A FOM of 10% means that for this case a conductivity was reached that was 10% of the maximum possible for copper. Throughout this patent, samples are compared to copper as the maximum possible theoretical conductivity, even when the metal used in a particular sample is a combination of copper and another metal, another metal or a combination of two other metals.

Example 2

Copper powder (dendritic, 3 micron, 99.7%) from Sigma-Aldrich (Milwaukee Wis.) was cleaned by stirring it in 10% aqueous hydrochloric acid, followed by one rinse of water and 3 rinses of methanol. The copper powder was allowed to dry in air for about 1 hour. A 20 cm diameter #270 sieve was placed at the top of a 20 cm diameter, 46 cm long tube of cardboard. The cardboard tube was placed over a set of seven 55 mm diameter type 54 Whatman filter paper circles. Tin powder (AEE 1–5 micron 99.9%) and then the copper powder was sprinkled into the sieve and allowed to settle down onto the filter paper to a depth that varied from sample to sample from approximately 0.1 mm to 0.5 mm. This method of application of one or more metal powders to substrate is referred to as the sieving method in subsequent examples.

In a first step, the metal powder was captured into a pattern by pressing a patterned die onto the powder using a Carver platen press (Model 3891, Wabash, Ind.) imparting 27 megapascals (MPa) onto the powder and filter paper. The excess powder was then removed.

In a second step, the captured metal powder and substrate were pressed together and densified between two smooth platens. In this second step, a Wabash press applied 112 MPa concurrently with heat at 200° C. for less than two minutes.

The total mass of the compacted metal was 0.459 grams. The resistance of the length of the pattern, 123 cm was 1.3 ohms. A summary of the preparation of this example and % FOM (calculated according to the method in Example 1) are shown in Table 1.

Examples 3 to 8

Examples 3 to 8 were prepared using the sieving method of Example 2. In one step, the metal powder was captured into a pattern and densified by pressing a patterned die onto the powder at the pressures shown in Table 1. Two different paper substrates and a combination of metal powders and particle types were used, as shown in Table 1. The resistance of each sample was measured and the calculated % FOM shown in Table 1.

Table 1 shows the results of using a combination of substrates and metal powders under different sets of conditions. The abbreviations for the substrates and metals are described in Table 2.

Examples 9 to 19

Examples 9 to 19 were prepared using the sieving, first capture step at a first pressure and second step wherein pressure is applied with two smooth platens as described for Example 2. The second pressure was applied at room temperature, except for Example 19 where it was applied at 100° C. The pressures used for each step are indicated in Table 1 (first pressure+second pressure). Materials and calculated % FOM are also shown in Table 1.

TABLE 1

| Example | Materials | Max Force (Mpa) | FOM % Cu max | Conditions |
|---|---|---|---|---|
| 2 | WFP + CUD + Sn | 27 (Step 1) 112 (Step 2) | 45 | two step press plus 200° C. |
| 3 | WFP + CUD + Sn | 386 | 14 | one step press |
| 4 | WFP + CUD | 340 | 11 | one step press |
| 5 | WFP + CUS | 335 | 2.4 | one step press |
| 6 | HCP + CUD | 370 | 5.6 | one step press |
| 7 | HCP + CUD + Sn | 370 | 5.2 | one step press |
| 8 | WFP + CUD + Sn | 144 | 13 | one step press |
| 9 | WFP + CUD + Sn | 29 + 112 | 15 | two step press |
| 10 | SPA + CUD + Sn | 61 + 112 | 3.4 | two step |
| 11 | PSB + CUD + Sn | 61 + 112 | 5.9 | two step |
| 12 | PEC + CUD + Sn | 61 + 112 | 5.0 | two step |
| 13 | NSB + CUD + Sn | 61 + 112 | 3.6 | two step |
| 14 | PEP + CUD + Sn | 61 + 112 | 6.9 | two step |
| 15 | WFP + Al + Sn | 90 + 112 | 0.97 | two step |
| 16 | WFP + Al | 90 + 112 | 1.2 | two step |
| 17 | WFP + CUF + Sn | 90 + 112 | 15 | two step |
| 18 | TPP + CUD + Sn | 27 + 112 | 3.3 | two step |
| 19 | TPP + CUD + Sn | 27 + 112 | 5.2 | two step + 100° C. Heat |

TABLE 2

Abbreviations for Table 1

| Substrate material | Abbr. | Source Company |
|---|---|---|
| Whatman 54 Filter paper | WFP | Whatman Inc, Clifton, NJ |
| Polypropylene SMS Fiberweb | PPF | BBA Non-wovens Simpsonville, SC |
| Polyester Pulp PGl Style ww-229 | PEP | Polymer Group Inc, Benson, NC |
| Teslin ™, porous polyethylene | TPP | PPG Industries Pittsburgh, PA |
| Silk 100% | SPA | Shamash & Sons, New York, NY |
| Polyester 100% cloth | PEC | Sankei Co, Ltd Japan |
| Hammermill copy plus 20/50 lb | HCP | International Paper, Memphis, TN |
| Polypropylene Spun bound | PSB | Polymer Group Inc, Benson, NC |
| Nylon spun bound | NSB | Cerex, Cantonment, Fl |
| Copper powder dendritic | CUD | Sigma-Aldrich Cat#357456 Milwaukee, WI |
| Copper powder flake | CUF | Sigma-Aldrich Cat#292583, Milwaukee, WI |
| Aluminum powder spherical | Al | Alfa Aesar cat#10576, Ward Hill, MA |
| Tin powder | Sn | Atlantic Equipment Engineers Sn-102, Bergenfield, NJ |

Example 20

Figure 6:
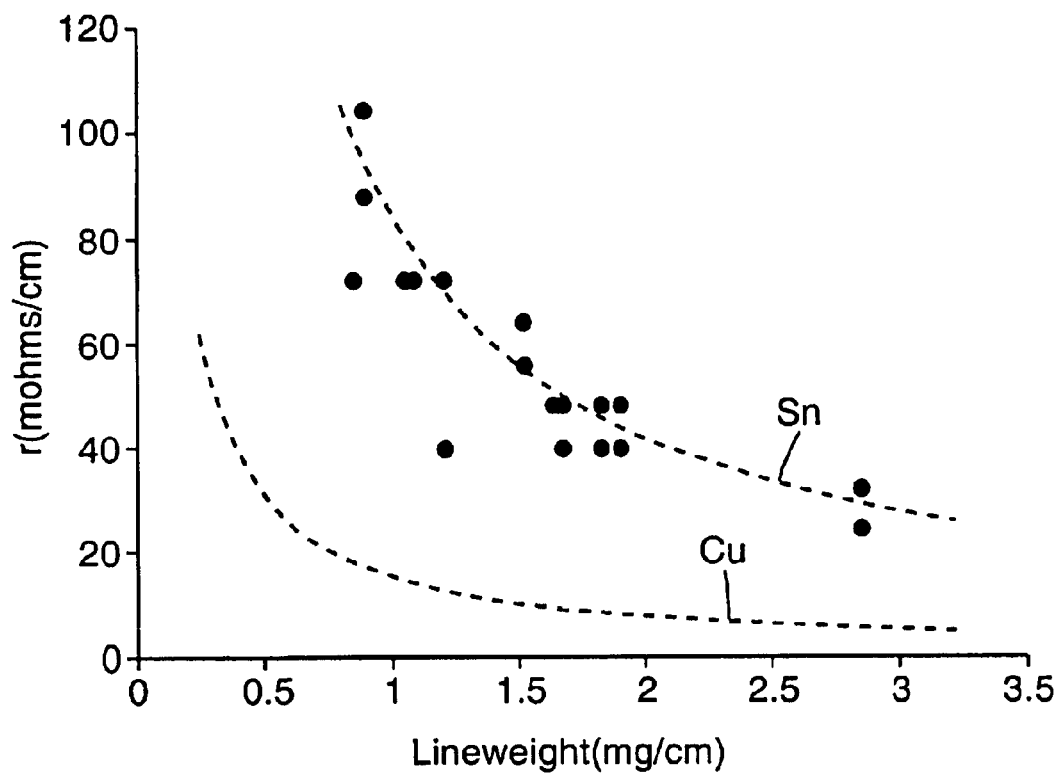
FIG. 6 is a plot of resistance as a function of line weight for paper substrates with copper conductive patterns.

Copper powder as described in Example 2 was sieved onto Whatman 54 filter paper. The patterns were captured as follows: a matching set of steel dies were used, 2" (5 cm) in diameter and 0.75" (1.9 cm) thickness. Each die had a set of two circular ridges 0.4 mm wide, 39 mm and 40 mm in diameter, 0.5 mm high and separated by 0.6 mm. One die had a 0.125" (0.3 cm) diameter guide pin at the center of the die. The other die had a corresponding hole in the center of the die for alignment purposes. The filter paper substrates had previously been punched with a 0.25" (0.6 cm) paper punch to allow the guide pin to pass through the paper. The copper powder coated paper substrate was sandwiched between the dies and pressed in a Carver platen press for 2 seconds at 330 MPa capturing and densifying the powder in a single step. A series of samples were prepared in this manner in which the mass of the copper powder was varied while the line width remained constant. The measured resistance per unit length is shown in FIG. 6. The theoretical resistance corresponding to a perfect copper line and a perfect tin line are also shown as dotted lines.

Example 21

Figure 7:
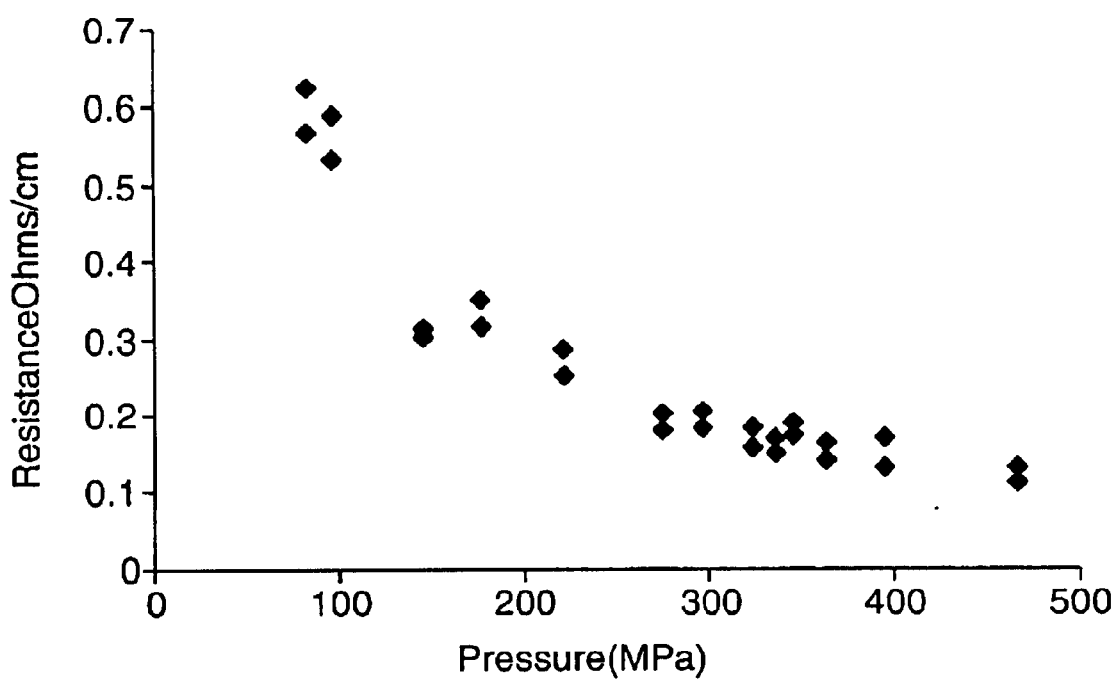
FIG. 7 is a plot of resistance as a function of the applied pressure used for densification.

Samples were prepared in a manner similar to that of Example 20 except that the copper powder had been left open to the air in a tray for 6 days after cleaning and before preparation of the samples. Samples were pressed at pressures ranging from 80 to 420 MPa. The resistance of the samples was measured and (since the amount of copper captured varied from sample to sample) normalized to a capture weight corresponding to a capture thickness of 50 microns. The results are plotted in FIG. 7.

Example 22

The resistance values of the samples for Example 20 were normalized to a line thickness of 50 microns and then averaged. The resistance values for the samples of Example 21 that were prepared at the pressure used for Example 20 (330 MPa) were similarly averaged (they had previously been normalized to a line thickness of 50 microns in Example 21). The samples for Example 20, prepared from freshly cleaned copper powder, gave a normalized average resistance of 0.054 ohms/cm. The samples of Example 15, prepared from the same copper powder after aging in air for 6 days, gave a normalized average resistance of 0.168 ohms/cm. The increase in the resistance of samples in Example 21 is believed to be due to the formation of oxide on the copper powder as it is exposed to air.

Example 23

Four samples were prepared using the one step procedure and materials of Example 20 at a pressure of 250 MPa. The resistance of the circuits was measured as in Example 1. The samples were then set into an aluminum foil tray and placed for 10 minutes in an oven at 200° C. The samples were removed and the resistance was measured again. These data show a reduction in resistance after heat treatment. The before and after resistances of the eight circuits are summarized in Table 3:

TABLE 3

Summary of resistances before and after heat treatment

| sample | a | b | c | d | e | f | g | h |
|---|---|---|---|---|---|---|---|---|
| ohms-before | 3.9 | 3.5 | 3.3 | 3.2 | 4 | 3.7 | 2.2 | 2.2 |
| ohms-after | 2.2 | 2.1 | 1.6 | 1.9 | 2 | 1.9 | 1.2 | 1.2 |

Example 24

A copper powder coated piece of Whatman 54 filter paper was placed between matching dies as described in Example 20. Rather than place the die in a platen press, the die was struck once with a hammer to compress the powder. The resulting copper circuits appeared similar to those prepared by pressing in the platen press. This demonstrates that very short contact times including rapid impact are useful for the practice of this invention.

Example 25

Copy paper (Hammermill CopyPlus 20/50 lb) was cut into 2" by 2" squares. A set of 4 samples were coated with copper powder (3 micron dendritic, as-received from Sigma-Aldrich) at a distribution of roughly 1.2 grams of copper powder covering the 2" by 2" area (6.45 cm$^2$) of each paper substrate. The coating (sieving) method was that of Example 2. A patterned die was used to compress the powder at a pressure of 370 MPa. The substrates were weighed before and after the circuit was formed, and the average circuit weight was 0.034 g, or 0.0014 g/cm of circuit line. The average resistance of the circuit lines was 0.19 ohms/cm. A second set of samples was prepared in an identical manner except that an underlayer of tin powder was first sprinkled onto the substrates. The average weight of the circuit lines was 0.0017 g/cm and the average resistance was 0.17 ohm/cm.

The two sets of samples were then subjected to adhesion tests according to the procedure described below. This test also tests the flexibility range of the substrates having metal patterns thereon.

A 1 mm wide slit was cut into each sample to break the circuit lines into two partial circles (358° rather than 360°). Ohmmeter probes were attached to the circuits on each side of the slits. The samples were then bent around a series of decreasing diameter metal or glass rods (20.1, 12.7, 10.5, 9, 8, 7, 6, 5, 4, and 3 mm diameters), each time straightening the sample before bending it around the next size rod. Resistance measurements were made before, during, and after bending the sample around each rod size. If a circuit pattern cracks or delaminates from the substrate during the bending process, resistance becomes infinite. Samples without a tin underlayer were able to bend around a 20.1 mm diameter rod without delamination of the metal pattern from the substrate, showing useful flexibility. The set of samples with the tin underlayer were also able to bend around 20.1 diameter rods, and around rods as small as 3 mm in diameter without the circuit lines delaminating from the substrates. In one sample, the circuit pattern did not crack when wrapped around the 3 mm rod and its measured resistance, over the 12 cm circumference of the line, increased from 2.3 ohms to 3.6 ohms while bent around the rod and back to 2.4 ohms after bending. This experiment illustrates the improved durability with respect to bending of circuit patterns when an underlayer of tin is used.

Example 26

This example demonstrates a two-step process, where the metal powder composition was captured using a hydraulic press and further densified using ultrasonic energy.

Cu powder (dendritic, Sigma-Aldrich) was pressed as a pattern in one step at 340 MPa on filter paper as in Example 4. A segment of the pattern was further treated with ultrasonic energy. An ultrasonic horn with a 25 mm by 1 mm raised portion on the end of the horn tip, powered by a Branson 900M 2000 watt power supply using a 1:1 booster, at 20 kHz, was pressed onto a portion of the captured pattern at 6.9 MPa. Then 20% ultrasonic power was applied for 200 ms. The pattern before sonicating had a resistance of 0.2 ohms/cm. After sonicating the best result produced a 40% reduction in resistance to 0.12 ohms/cm.

Example 27

Copper powder (dendritic, Sigma-Aldrich) was sprinkled onto filter paper (Whatman 54) using the sieving method of Example 2. The Cu powder layer was pressed using the ultrasonic horn tip described in Example 26, at a pressure of 6.9 MPA for 1 second and then sonicating for 200 ms at 20% power, 20 kHz, 1:1 gain on the Branson 900M power supply. This produced a pattern having a resistance of 0.28 ohms/cm.

Example 28

Two layers of metal, tin and then copper, were sprinkled onto a piece of Teslin™ (0.22 mm thickness) consisting of a 1:3 ratio of tin and copper, respectively. The Cu powder was obtained from Sigma-Aldrich (Cu, dendritic, 3 micron, 99.7%). The Sn powder was obtained from Micron Metals (Sn, tetragonal, 5 micron, 99.9%). The layered powders were set on a stage under the ultrasonic horn. The horn was pressed onto the sample at 6.9 MPa using a 25 mm by 1 mm raised portion of the die before application of ultrasonic energy. The horn operated at 20 kHz, for 1 second, using a 0.6 gain horn adapter on a Branson 900M 2000 watt power supply. Pressing resulted in a metal pattern thickness of approximately 25 microns. This produced a circuit having a resistivity of 0.008 ohm/cm with excellent adhesion. Adhesion resistance was tested using tape and fingernail tests: tape available from 3M Company, St. Paul Minn. under the trade designation Scotch Magic Tape was applied to the metal traces and peeled off, removing none of the metal adhered to the substrate. The metal trace was scraped with a fingernail using moderate force and the trace remained adhered to the substrate.

Samples prepared with shorter sonication times had larger resistances: (200 ms, 0.2 ohm/cm), (375 ms, 0.07 ohms/cm), (500 ms, 0.07 ohms/cm), (750 ms, 0.04 ohms/cm).

Example 29

Via holes of diameter 0.2 mm were punched into a Teslin substrate and a liner was placed under the entire piece. Tin and then copper powder was sprinkled onto the substrate filling the holes and evenly coating the material. The sample was pressed in a two-step process under similar conditions to those described in Example 2. This produced a circuit on one side with metal-containing vias formed through the substrate. The pressed metal powder maintained enough structural integrity to bridge the via hole and partially fill it. The metal-filled via was shown to be conductive from the non-pattern side of the substrate and exhibited a resistance comparable to that of a pressed metal trace, determined by measuring the resistance using voltmeter probes on both sides of the via. Both the metal powder in the via and the substrate compressed.

Example 30

Fifty grams of copper powder (dendritic, Sigma-Aldrich) were placed in 100 ml of formic acid in a stoppered flask. The flask was closed and shaken to completely mix the copper powder with the acid. 400 ml of water was added and the liquid was then removed by using an aspirator and #4 filter paper. An additional 1000 ml of water was filtered through the powder to rinse the formic acid from the powder. While still damp and caked, 20 g of the moist copper powder was mixed with 8 ml of water to make a slurry. The slurry was knife coated onto a 0.18 mm thick Teslin substrate using a notch bar with a 0.25 mm gap above the substrate. The slurry-coated was allowed to absorb the excess water from the slurry for about 1 minute, causing the slurry to solidify into a damp but easy to handle coating. Several 6 cm by 6 cm samples were cut out of the substrate while the coating was still damp. The samples were pressed as described for the first step in Example 2 at a pressure of 36 MPa. The samples were allowed to dry, and the excess copper powder was blown from the substrate using compressed air. At this point, the circuit on the samples had a resistance of typically 65 ohms over the 123 cm long spiral path of the circuit. Two 1 mm diameter holes were punched 12 mm apart into a 0.08 mm thick by 89 mm wide tape available from 3M, St. Paul, Minn. under the trade designation Scotch Hi-Temp Masking Tape. The tape was placed over the circuit of one sample so that the holes coincided with the ends of the circuit. The tape afforded extra strength to the trace and the holes allowed access to the trace for resistance measurements. Excess tape was trimmed from the sample to give a 6 cm by 6 cm area. The sample with the tape applied was placed between two 6 cm by 6 cm by 1.2 cm stainless steel plates and compressed to 113 MPa. The resulting sample had a resistance of 39 ohms measured through the holes in the tape. The sample was folded and sharply creased, Teslin side in. The resistance increased to 46 ohms. No breaks were visible in the circuit.

This examples demonstrates the process of coating metal powder as a slurry and it also demonstrates the creation of a rugged circuit using an additional layer of material applied over the circuit.

Example 31

A sample was prepared using according to Example 9, but this sample had several cracks that created infinite resistance across those defects. It was then was treated with microwave energy: The sample was placed in a Canada Technologies Microwave 2100 that operated at 6.3 GHz at 200 watts for 30 seconds. The microwave energy bonded the metal crack and restored the conductivity to the metal pattern.

Example 32

A test was performed to measure the differences in the properties of paper and compressible material and a comparative material (polypropylene film) under compression.

An Instron 4505 Instrument (Instron Corporation, Canton, Mass.) was setup in the compression mode with 100K Newton fixtures. The Instron was programmed to compress at a rate of 0.025 inches/minute (0.64 mm/min). A stack of circular sample coupons, 1.27 cm in diameter, was prepared from pieces punched out from a sheet of each material (each material was supplied as a sheet or film). Each sample stack was then place between the platens of the Instron and compressed to an initial thickness at approximately 10 psi (0.07 MPa) to begin the test run. The thickness of the material is automatically measured by the Instron, the diameter was measured using a pair of calipers and measurements were documented at corresponding pressures and thicknesses. The Instron reports pound-force. The psi values are the pound-force divided by the area calculated from the diameter measurements at each pound-force data point. Therefore if the material expands laterally, the area will increase and the corresponding psi will decrease at the same pound-force value. The volume data is the area multiplied by the thickness at a specific pound-force data point.

Three kinds of paper material, a filled porous polymer and a comparative highly dense polymer were tested. The paper samples were Whatman 54 Filter paper (Whatman Inc, Clifton N.J.), Hammermill copy paper (International Paper, Memphis Tenn.) and tan file folder card stock (Globe-Weis Premium File Folders, ATAPCO, Baltimore, Md.). The filled porous polymer was Teslin (0.18 mm, PPG Industries Pittsburgh Pa.). The comparative highly dense polymer was polypropylene 0.46 mm film, (3M Company St. Paul Minn.).

Table 4 lists the percent change in diameter at pressures applied to the circular coupons, where % change=100×{[(final diameter)−(initial diameter)]/(initial diameter)}. The diameter is the dimension of the sample that is perpendicular to the direction of the applied pressure. The paper samples change very little in the diameter dimension under pressure. Teslin demonstrated a small change in diameter while comparative polypropylene showed a much greater change in diameter in the range of pressures useful in the practice of this invention. That is, the comparative polypropylene showed a large increase in the dimension perpendicular to the direction of the applied pressure, due to lateral flow of the sample.

Figure 8:
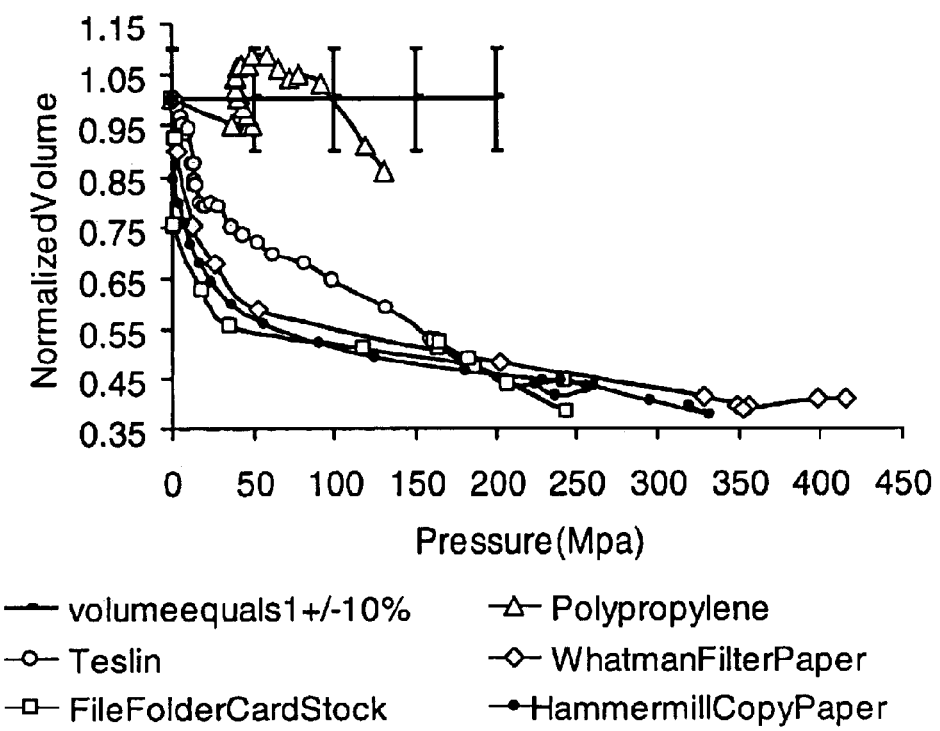
FIG. 8 is a plot of normalized substrate volume as a function of applied pressure.

FIG. 8 shows the data for normalized volume versus pressure at each pressure. The normalized volume at each pressure is shown as a decimal fraction at that of the initial volume for each sample, and is calculated by dividing the volume at each pressure by the volume at 0.07 MPa for that sample. It can readily be seen from FIG. 8 that paper materials and Teslin have a significant change in volume with pressure while the comparative dense polypropylene volume remains nearly constant up to pressures of 17,000 psi (117 MPa). The paper materials and Teslin reduced in volume nearly 40% at pressures of 17,000 psi (117 MPa) and above.

Figure 9:
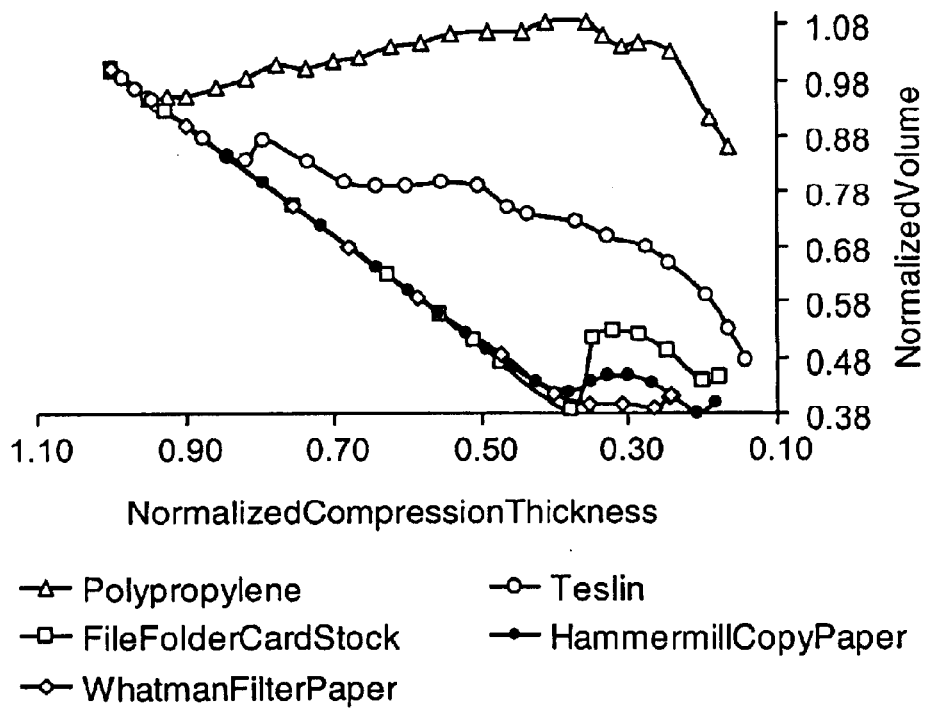
FIG. 9 is a plot of normalized substrate volume versus normalized substrate compression thickness.

FIG. 9 illustrates the relationship between normalized compression thickness (the dimension in the direction parallel to the direction of the applied pressure) and normalized volume. Normalized compression thickness is the thickness at a given pressure, divided by initial compression thickness at 0.07 MPa. The comparative polypropylene volume is substantially constant (+about 10% of the initial volume); although it decreases greatly in thickness it increases in diameter. Materials useful in the practice of this invention show large decreases in compression thickness under applied pressure but little or no increase in diameter, leading to overall decreases in volume. As FIG. 9 illustrates, materials, particularly paper, that change volume primarily due to a change in compression thickness are indicated by a slope of 1.0.

TABLE 4

| Material | Change in Diameter with Applied Pressure | Pressure, psi | Pressure, Mpa |
|---|---|---|---|
| Whatman 54 Filter Paper | <5% | 50,000 | 345 |
| Hammermill Copy Paper | <5% | 37,000 | 255 |
| File Folder Card Stock | <5% | 35,000 | 241 |
| Teslin ™ | ~40% | 7,600 | 52 |
| Teslin ™ | ~73% | 17,000 | 117 |
| Polypropylene | ~72% | 7,600 | 52 |
| Polypropylene | ~119% | 17,000 | 117 |

A number of embodiments of the invention have been described. Nevertheless, it will be understood that various modifications may be made without departing from the spirit and scope of the invention. Accordingly, other embodiments are within the scope of the following claims.

What is claimed is:

1. An article comprising circuit elements comprising a conductive pattern on a substrate, wherein the conductive pattern consists essentially of at least one densified metal powder, and wherein the substrate is selected from the group, consisting of paper, fibrous materials, fiber-like materials, non-woven materials and woven materials.

2. The article of claim 1, wherein the conductive pattern has a % FOM of at least about 5%.

3. The article of claim 1, wherein the conductive pattern has a % FOM of at least about 10%.

4. The article of claim 1, wherein the metal powder is selected from the group consisting of copper, tin, lead, silver, gold, platinum, graphite, aluminum, nickel, iron, steel, zinc and alloys and combinations thereof.

5. The article of claim 4, wherein the densified metal powder comprises copper.

6. The article of claim 5, wherein the copper comprises dendritic copper.

7. The article of claim 4, wherein the densified metal powder further comprises tin.

8. The article of claim 1, wherein the substrate is selected from the group consisting of paper and materials that are at least about 20% compressible.

9. The article of claim 1, further comprising a conductive via through the substrate.

10. The article of claim 1, further comprising a protective layer on the conductive pattern.

* * * * *

UNITED STATES PATENT AND TRADEMARK OFFICE
CERTIFICATE OF CORRECTION

PATENT NO. : 6,805,940 B2
DATED : October 19, 2004
INVENTOR(S) : Koskenmaki et al.

It is certified that error appears in the above-identified patent and that said Letters Patent is hereby corrected as shown below:

Column 6,
Line 5, delete "25°C" and insert -- -25°C --.

Column 15,
Line 56, delete "+" and insert -- ± --, therefore.

Column 16,
Line 33, after "group" delete ",".

Signed and Sealed this

Twenty-fifth Day of October, 2005

JON W. DUDAS
*Director of the United States Patent and Trademark Office*